United States Patent
Joo et al.

(10) Patent No.: US 8,648,409 B2
(45) Date of Patent: Feb. 11, 2014

(54) NON-VOLATILE MEMORY DEVICE AND METHOD FOR FABRICATING THE SAME

(75) Inventors: Han-Soo Joo, Gyeonggi-do (KR);
Dong-Kee Lee, Gyeonggi-do (KR);
Sang-Hyun Oh, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/238,295

(22) Filed: Sep. 21, 2011

(65) Prior Publication Data
US 2012/0223382 A1 Sep. 6, 2012

(30) Foreign Application Priority Data
Mar. 4, 2011 (KR) .......................... 10-2011-0019440

(51) Int. Cl.
*H01L 29/792* (2006.01)
(52) U.S. Cl.
USPC ...................... 257/326; 257/324; 257/E29.17
(58) Field of Classification Search
USPC ........... 257/326, 324, 29.17, E29.17, 29.17 E
See application file for complete search history.

(56) References Cited
U.S. PATENT DOCUMENTS

| 2010/0207195 A1* | 8/2010 | Fukuzumi et al. | ............. 257/326 |
| 2011/0180866 A1* | 7/2011 | Matsuda et al. | ............. 257/324 |

FOREIGN PATENT DOCUMENTS

| JP | 2010-021390 | 1/2010 |
| KR | 101109316 | 2/2012 |
| WO | WO 2009075370 | 6/2009 |

OTHER PUBLICATIONS

Notice of Allowance issued by the Korean Intellectual Property Office on Nov. 9, 2012.
Office Action issued by the Korean Intellectual Property Office on May 23, 2012.

* cited by examiner

*Primary Examiner* — Zandra Smith
*Assistant Examiner* — Jamie C Niesz
(74) *Attorney, Agent, or Firm* — IP & T Group LLP

(57) ABSTRACT

A method for fabricating a non-volatile memory device includes forming a channel link layer and an isolation layer surrounding the channel link layer over a substrate, forming a stack structure having interlayer dielectric layers that are alternately stacked with gate electrode layers over the channel link layer and the isolation layer, and forming a pair of channels connected to the channel link layer through the stack structure, and a memory layer interposed between the channel and the stack structure.

9 Claims, 4 Drawing Sheets

NON-VOLATILE MEMORY DEVICE AND METHOD FOR FABRICATING THE SAME

CROSS-REFERENCE TO RELATED APPLICATIONS

The present application claims priority of Korean Patent Application No. 10-2011-019440, filed on Mar. 4, 2011, which is incorporated herein by reference in its entirety.

BACKGROUND

1. Field

Exemplary embodiments of the present invention relate to a non-volatile memory device and a method for fabricating the same, and more particularly, to a non-volatile memory device with a three-dimensional structure, where a plurality of memory cells are stacked along a channel protruding perpendicularly from a substrate, and a method for fabricating the same.

2. Description of the Related Art

A non-volatile memory device is a memory device where stored data is retained even when a power supply is cut off. An example of a non-volatile memory device is a flash memory.

Meanwhile, as an increase in the degree of integration of a memory device with a two-dimensional structure, wherein memory cells are formed as a single layer on a silicon substrate, approaches a limit, a proposed configuration is a non-volatile memory device with a three-dimensional structure, wherein a plurality of memory cells are stacked along a channel protruding perpendicularly from a silicon substrate.

The configuration of a conventional non-volatile memory device with a three-dimensional structure will be described in more detail below.

A lower selection transistor, memory cells with a multilayer structure, and an upper selection transistor are sequentially stacked over a silicon substrate to form a non-volatile memory device with a three dimensional structure. The lower selection transistor is formed with a pillar-shaped lower channel connected to a source region formed in the silicon substrate, a lower selection gate electrode arranged on a sidewall of the lower channel, and a gate dielectric layer interposed between the lower channel and the lower selection gate. The memory cells with a multilayer structure are formed with a pillar-shaped cell channel connected to the lower channel, cell gate electrodes arranged on a sidewall of the cell channel in a multilayer structure, and a memory layer interposed between the cell gate electrodes and the cell channel. The upper selection transistor is formed with a pillar-shaped upper channel connected to the cell channel, an upper selection gate electrode arranged on a sidewall of the upper channel, and a gate dielectric layer interposed between the upper channel and the upper selection gate.

More specifically, the lower channel, the cell channel, and the upper channel are connected to one another and protrude perpendicularly from the substrate. Also, the lower selection gate electrode, the cell gate electrodes, and the upper selection gate electrode are stacked in a multilayer structure along the channels with insulation layers interposed between the electrodes to isolate the electrodes from one another.

To increase the integration degree of conventional non-volatile memory devices by using the above-described method, a number of memory cells may be stacked. However, in increasing the number of stacked memory cells, physical limits are being reached with available fabrication processes.

Furthermore, according to the conventional art, since a process of forming the lower selection transistor, a process of forming the memory cell with a multilayer structure, and a process of forming the upper selection transistor are separately performed in a sequential manner, the fabrication process may be complicated.

SUMMARY

An exemplary embodiment of the present invention is directed to a non-volatile memory device and a method for fabricating the same, which may increase the degree of integration of a non-volatile memory device and also may achieve process simplification.

In accordance with an embodiment of the present invention, a method for fabricating a non-volatile memory device includes: forming a channel link layer and an isolation layer surrounding the channel link layer over a substrate; forming a stack structure having interlayer dielectric layers that are alternately stacked with gate electrode layers over the channel link layer and the isolation layer; and forming a pair of channels connected to the channel link layer through the stack structure, and a memory layer interposed between the channel and the stack structure.

In accordance with another embodiment of the present invention, a non-volatile memory device includes: a channel link layer arranged over a substrate; an isolation layer arranged over the substrate to surround the channel link layer; a stack structure arranged over the channel link layer and the isolation layer having interlayer dielectric layers that are alternately stacked with gate electrode layers; a pair of channels connected to the channel link layer through the stack structure; and a memory layer interposed between the channel and the stack structure.

DETAILED DESCRIPTION

Figure 1:
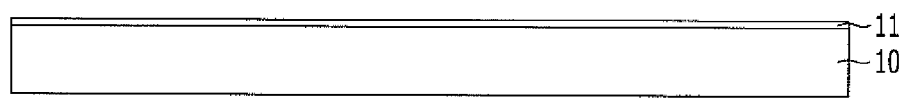
FIGS. 1 to 9 are diagrams illustrate a non-volatile memory device and a method for fabricating the same in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 7:
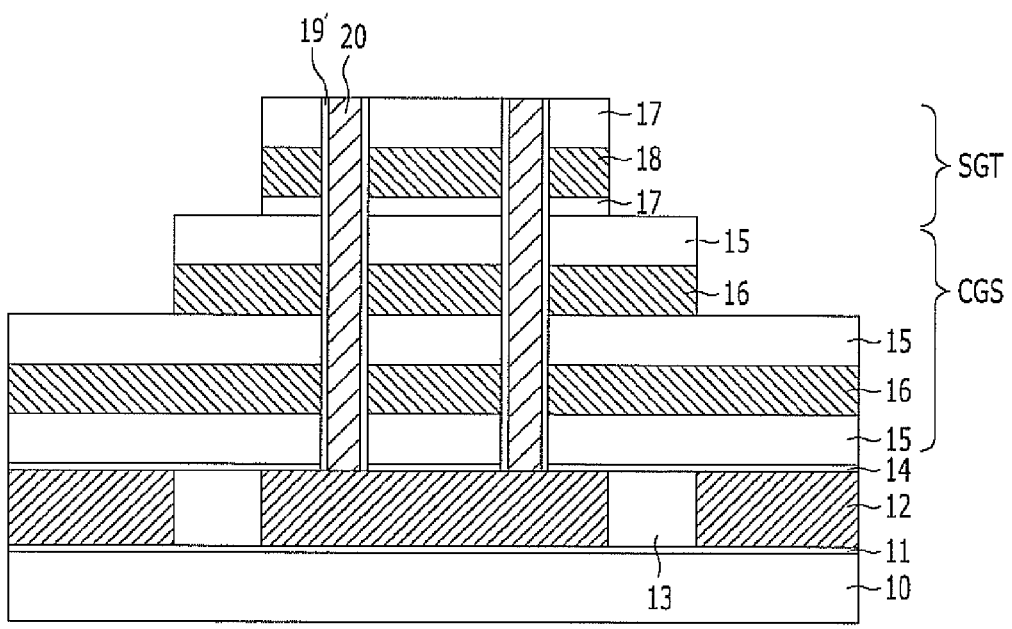
Figure 8:
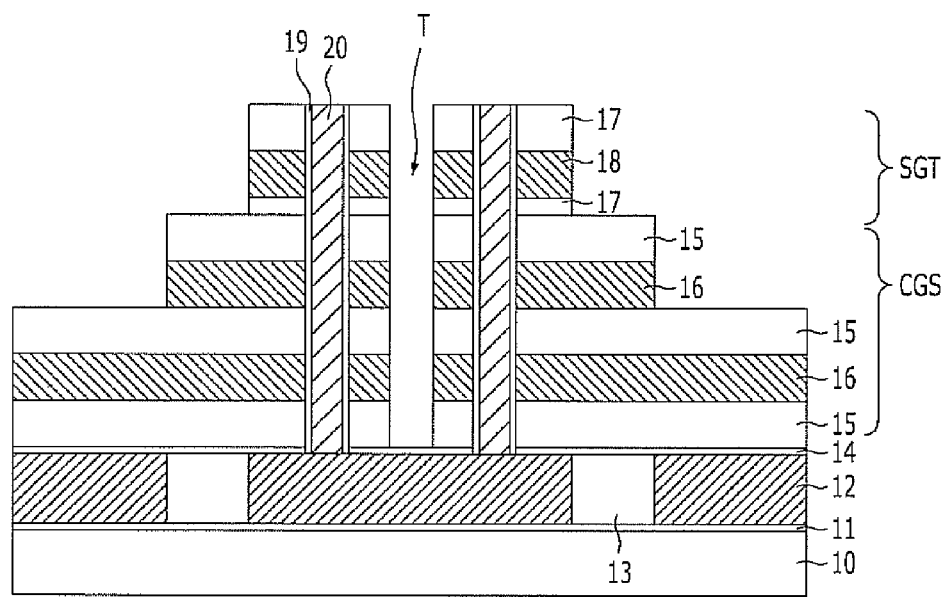
Figure 9:
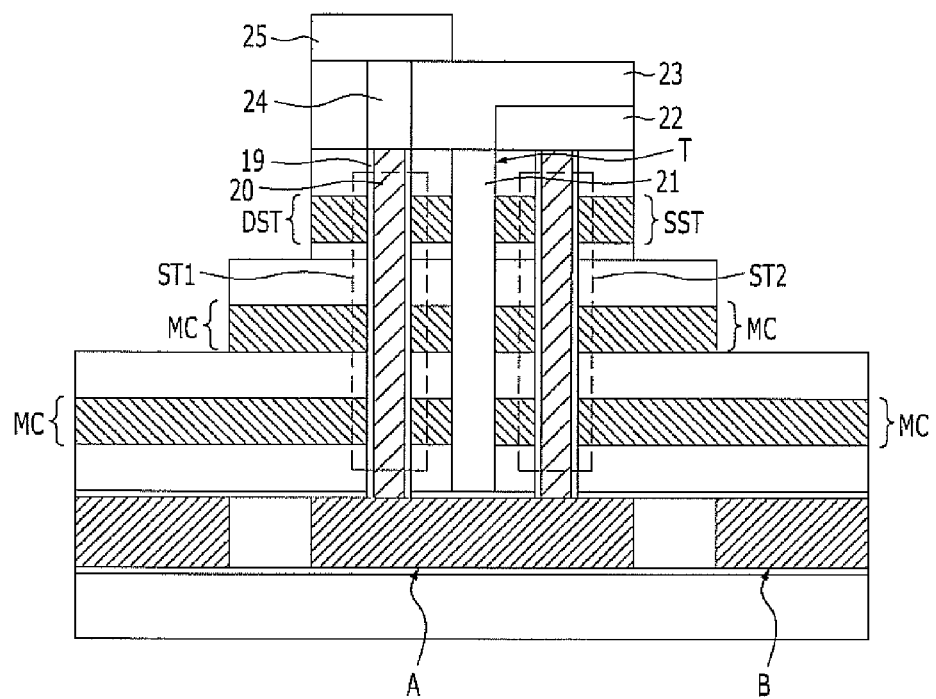

FIGS. 1 to 9 are diagrams illustrating a non-volatile memory device and a method for fabricating the same in accordance with an embodiment of the present invention. Specifically, FIG. 9 is a cross-sectional view illustrating the non-volatile memory device in accordance with the embodiment of the present invention, and FIGS. 1 to 8 are cross-sectional views illustrating intermediate processes for fabricating the non-volatile memory device illustrated in FIG. 9.

Referring to FIG. 1, a first buffer layer 11 is formed on a substrate 10.

The substrate 10 may be a semiconductor substrate, such as a silicon substrate. However, the present invention is not limited to including a silicon substrate.

The first buffer layer 11 isolates the substrate 10 from a channel link layer 12, and the first buffer layer 11 may be formed of an insulation layer, such as an oxide layer.

Figure 2:
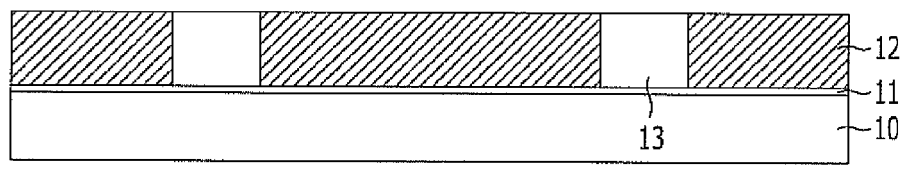

Referring to FIG. 2, the channel link layer 12 and isolation layer 13 are formed on the first buffer layer 11.

The channel link layer 12 may be an isolated pattern having various planar shapes, such as a bar shape, and the isolation layer 13 may be formed to surround the channel link layer 12. More specifically, the channel link layer 12 may be isolated from other patterned portions of the channel link layer 12 by the isolation layer 13. When a plurality of channel link layers 12 are arranged on the first buffer layer 11, the plurality of channel link layers 12 are isolated from one another by the isolation layer 13.

The channel link layer 12 may be formed of a conductive material, and, for example, may be formed of polysilicon doped with a high concentration of impurities, such as $N^+$ polysilicon. The isolation layer 13 may be formed of an insulation material, such as oxide or nitride.

The channel link layer 12 and the isolation layer 13, as described above, may be formed using one of the following exemplary methods.

For example, a conductive material for forming the channel link layer 12 is first deposited on the first buffer layer 11, and selectively etched to form a desired pattern of the channel link layer 12. Next, an insulation material for covering a resultant structure, including the channel link layer 12, is deposited and subject to a planarization process until the channel link layer 12 is exposed. The isolation layer 13 is filled in spaces where the channel link layer 12 is not formed.

As another example, an insulation material for forming the isolation layer 13 is first deposited on the first buffer layer 11, and selectively etched to form the isolation layer 13. As a result of the etching, a space is formed where the channel link layer 12 is to be formed. A conductive material for covering a resultant structure, including the isolation layer 13, is deposited and subject to a planarization process until the isolation layer 13 is exposed. The channel link layer 12 is filled in the space where the isolation layer 13 is not formed.

Figure 3:
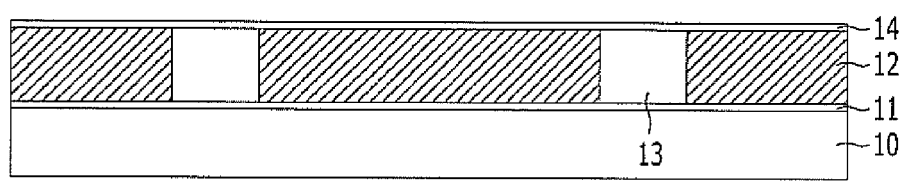

Referring to FIG. 3, a second buffer layer 14 is formed on the channel link layer 12 and the isolation layer 13.

The second buffer layer 14 protects the channel link layer 12 during a subsequent process, and may be formed of an insulation layer such as an oxide layer.

As a result of the processes of FIGS. 1 to 3, the channel link layer 12 is isolated by the first buffer layer 11, the second buffer layer 14, and the isolation layer 13.

Figure 4:
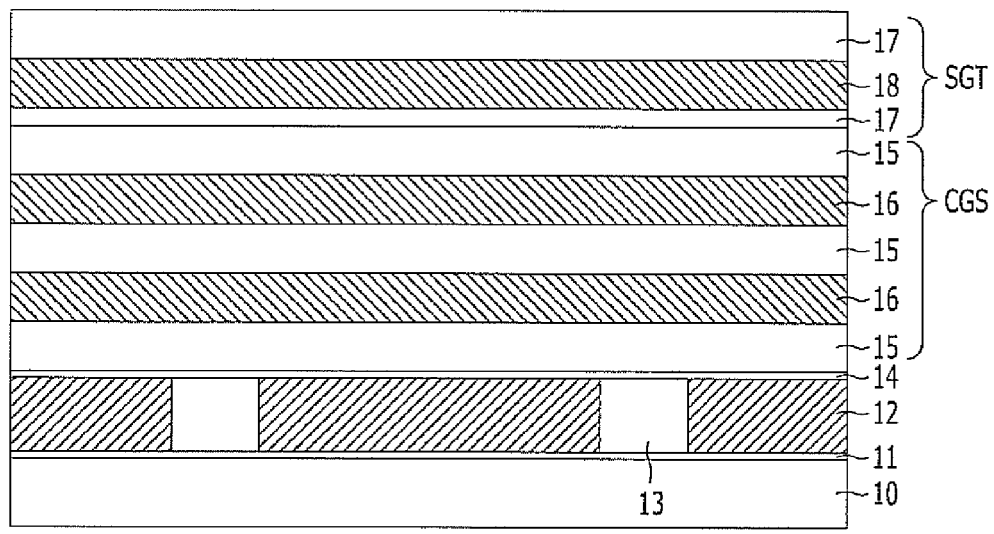

Referring to FIG. 4, first interlayer dielectric layers 15 and first gate electrode layers 16 are alternately formed on the second buffer layer 14 in order to form a plurality of memory cells stacked in the vertical direction. Hereinafter, a structure having the first interlayer dielectric layers 15 and the first gate electrode layers 16 alternately stacked will be referred to as a cell gate structure CGS. In such a cell gate structure, the lowermost layer and the uppermost layer may be formed of the first interlayer dielectric layer 15. However, the present invention is not limited to the described cell gate structure.

The first interlayer dielectric layers 15 isolate memory cells with from one another, and for example, may be formed of an oxide layer. The first gate electrode layers 16 form gate electrodes of the memory cells, and for example, may be formed of polysilicon or SiGe. In the present embodiment, two layers of the first gate electrode layers 16 are illustrated. However, the present invention is not limited to two first gate electrode layers 16. For example, the number of the first gate electrode layers 16 to be stacked may be changed.

A second interlayer dielectric layer 17, a second gate electrode layer 18, and another second interlayer dielectric layer 17 are sequentially formed on the cell gate structure CGS to form a select transistor. Hereinafter, a structure wherein the second interlayer dielectric layer 17, the second gate electrode layer 18, and the second interlayer dielectric layer 17 are sequentially stacked will be referred to as a select gate structure SGT.

The second gate electrode layer 18 forms a gate electrode of the select transistor, and for example, may be formed of polysilicon. The second interlayer dielectric layer 17 isolates the second gate electrode layer 18 from structures formed above and below the second gate electrode layer 18, and for example, may be formed of an oxide layer.

Figure 5:
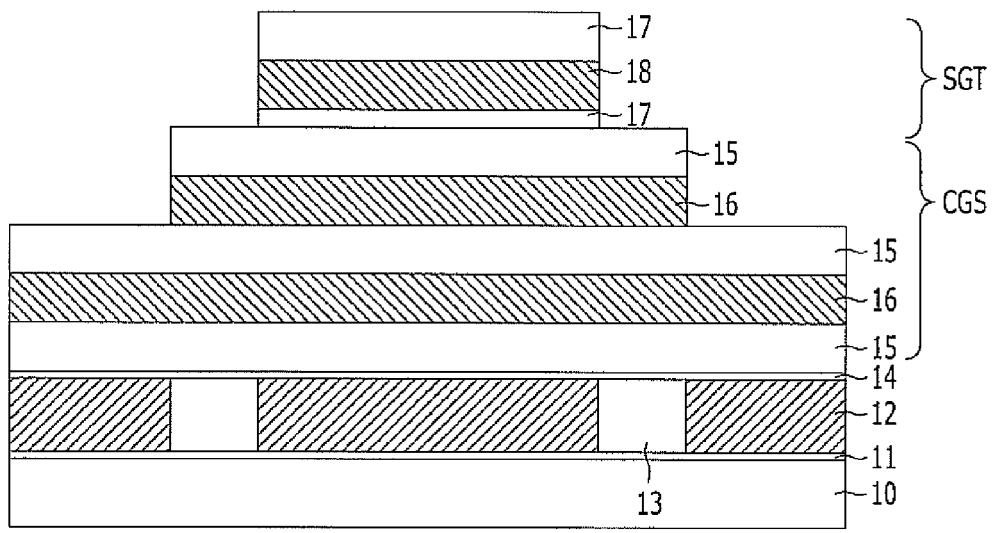

Referring to FIG. 5, the select gate structure SGT and the cell gate structure CGS are selectively etched, so that the select gate structure SGT and the cell gate structure CGS have a stepped configuration.

The stepped configuration means that a first gate electrode layer 16 of one layer laterally extends further than a first gate electrode layer 16 or a second gate electrode layer 18 positioned at a layer immediately above. In other words, the first dielectric layers 16 laterally extend further than the second dielectric layer 18, and the first dielectric layers 16 that are lower in the cell gate structure CGS extend further than the first dielectric layers 16 that are higher in the cell gate structure CGS. The process is performed to allow contacts to be formed on the first gate electrode layers 16 of respective layers. The first gate electrode layers 16 of respective layers may be connected to desired interconnections through contacts formed thereon.

Since the process of selectively etching the select gate structure SGT and the cell gate structure CGS to have a stepped configuration is well known in the art, detailed description thereof will be omitted.

Figure 6:
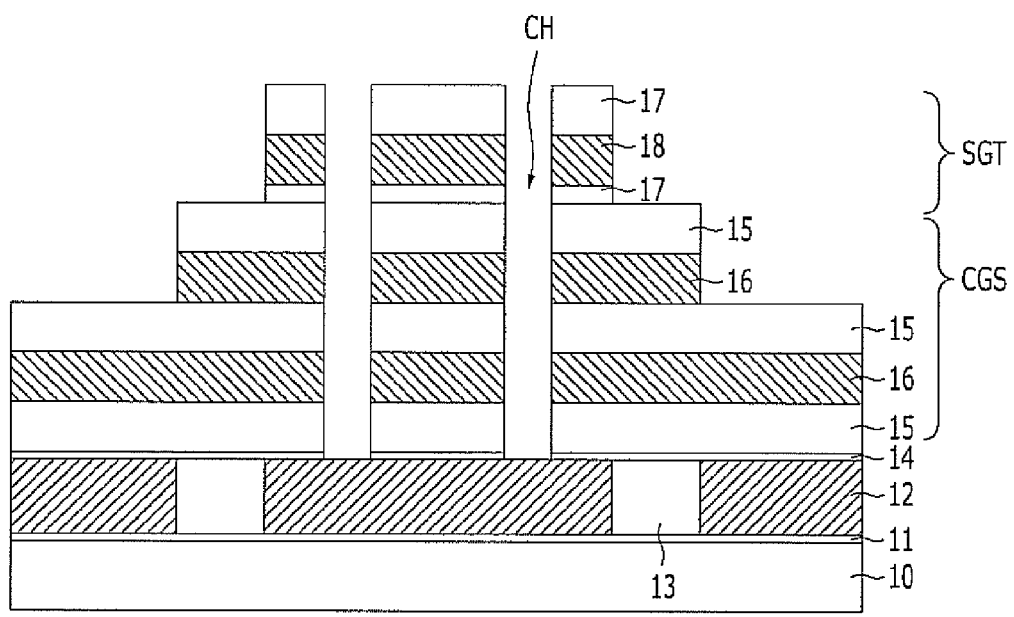

Referring to FIG. 6, the select gate structure SGT, the cell gate structure CGS, and the second buffer layer 14 are selectively etched to form a pair of channel holes CH that each exposes the channel link layer 12. The channel holes CH provide spaces where channels of the memory cells and the select transistors are to be formed.

Referring to FIG. 7, memory layers 19 are formed on sidewalls of the channel holes CH, and channel layers 20 are formed to be filled in the channel holes CH in areas where the memory layers 19 are formed.

The memory layer 19 may be formed by sequentially depositing a charge blocking layer, a charge trap layer, and a tunnel insulation layer, which are used as the memory layer 19, along the sidewalls of the channel holes CH. The channel layer 20 may be formed by depositing a designated semiconductor material (for example, a polysilicon layer) on the tunnel insulation layer, and performing a polishing process (for example, a chemical mechanical polishing (CMP) process) until the uppermost second interlayer dielectric layer 17 is exposed.

More specifically, the charge blocking layer substantially prevents charge leakage in the charge trap layer, and for example, may be formed of an oxide layer. The charge trap layer traps charge to store data, and for example, may be formed of a nitride layer. The tunnel insulation layer is provided for charge tunneling, and for example, may be formed of an oxide layer. That is, the memory layer 19 may have a triple structure of oxide-nitride-oxide (ONO).

In an exemplary embodiment, the channel layer 20 is filled in the channel holes CH. However, the present invention is not limited to filling the channel holes CH with the channel layer 20. In another embodiment, the channel layer 20 may be formed with a thickness that does not completely fill the channel holes CH, and the channel layer 20 may have a hollow cylindrical shape.

As a result of the process of FIG. 7, a pair of channel layers 20 passing through the select gate structure SGT and the cell gate structure CGS is formed and connected to each other through the channel link layer 12. Through this structure, the pair of channel layers 20 and the channel link layer 12 form one channel having approximately a U shape, which will be referred to as a U-shaped channel in the following description.

Referring to FIG. 8, to isolate the second gate electrode layer 18 and the first gate electrode layer 16 between the pair of channel layers 20, the select gate structure SGT and the cell gate structure CGS are selectively etched between the pair of channel layers 20 to form a trench T.

The trench T may have a slit shape extending perpendicular to the cross-sectional direction, and the trench T may have a depth to the extent that the bottom of the trench T is positioned below the lowermost first gate electrode layer 16.

Although not illustrated in FIG. 8, a silicide process is performed after forming the trench T, so that the sidewalls of the first gate electrode layers 16 and second gate electrode layer 18 that are exposed by the trench T may be silicified. The silicide process is performed to achieve low resistance. The silicide process may be performed using cobalt (Co), Nickel (Ni), and the like.

Referring to FIG. 9, an insulation material 21, such as oxide or nitride, is filled in the trench T. Also, a source line 22 is formed to be connected to one (for example, a right channel layer) of the pair of channel layers 20, and a bit line 25 is formed to be connected to the other one (for example, a left channel layer) of the pair of channel layers 20.

More specifically, the source line 22 is formed by deposited a material (for example, polysilicon doped with impurities or a metal such as tungsten) on a resultant structure including the trench filled by the insulation material 21 and is subject to a patterning process. The source line 22 is formed over and connected to the right channel layer.

A third interlayer dielectric layer 23 is formed to cover a resultant structure including the source line 22. The third interlayer dielectric layer is selectively etched to form a drain contact hole that exposes the left channel layer. Then, a conductive material is filled in the drain contact hole to form a drain contact 24 connected to the left channel layer through the third interlayer dielectric layer 23.

A material is deposited on the third interlayer dielectric layer 23 including the drain contact 24, and is subject to a patterning process to form the bit line 25. The bit line 25 is connected to the left channel layer through the drain contact 24.

The relative positions of the source line 22 and the bit line 25 may be changed. Furthermore, the source line 22 may be connected to the channel layer 20 through a contact, or the bit line 25 may be directly connected to the channel layer 20.

By using the above-mentioned method, the device illustrated in FIG. 9 may be formed.

Referring to FIG. 9, the U-shaped channel including the pair of channel layers 20 and the channel link layer 12 is arranged on the substrate 10. A plurality of memory cells MC and select transistors SST and DST are formed along the U-shaped channel. More specifically, a plurality of memory cells MC and a drain select transistor DST are formed along one (for example, the left channel layer) of the pair of channel layers 20, and a plurality of memory cells MC and a source select transistor SST are formed along the other one (for example, the right channel layer) of the pair of channel layers 20.

The memory cells MC and the drain select transistor DST formed along the left channel layer form a first string ST1, and the memory cells MC and the source select transistor SST formed along the right channel layer form a second string ST2. The first string ST1 and the second string ST2 are isolated from each other by the insulation material 21 but are also connected to each other by the channel link layer 12 to form one string.

For example, the left channel layer may be connected to the bit line 25, and the right channel layer may be connected to the source line 22.

According to the non-volatile memory device and the method for fabricating the same in accordance with the present invention, as described above, the plurality of memory cells are stacked along the U-shaped channel and the drain and source select transistors are formed above the memory cells. By this method, the string is formed in the U shape to increase the number of memory cells included in one string by at least twice as many memory cells as a non-volatile memory device that is formed in a linear shape.

Furthermore, the plurality of memory cells is stacked along the U-shaped channel and the drain and source select transistors are formed above the memory cells to simplify the fabrication process. Here, since all the selection transistors can be formed through a one-time process in accordance with the present invention, the fabrication process is simplified.

Moreover, the drain and source select transistors are formed above the plurality of memory cells stacked along the U-shaped channel so that a junction may be formed in the drain and source select transistors. Consequently, a non-volatile memory device is formed with a three-dimensional structure, which operates in an enhancement mode, resulting in enhanced performance of the memory device.

Meanwhile, even in the non-volatile memory device with a three-dimensional structure in accordance with an embodiment of the present invention, the formation of a peripheral element, for example a peripheral circuit transistor, may be used as in a general memory device.

To include a peripheral element, the channel link layer 12 (refer to arrow B of FIG. 9) not connected to the pair of channel layers 20 may be used as a gate of the peripheral circuit transistor. Meanwhile, the channel link layer 12 (refer to arrow A of FIG. 9) connected to the pair of channel layers 20 may connect the pair of channel layers 20 to each other.

In other words, the channel link layers 12 and the gate of the peripheral circuit transistor can be simultaneously formed. In such an example, the fabrication process can be more simplified.

According to the non-volatile memory device and the method for fabricating the same in accordance with the present invention, the degree of integration of a non-volatile memory device increases, and the fabrication process is simplified.

While the present invention has been described with respect to the specific embodiments, it will be apparent to those skilled in the art that various changes and modifications may be made without departing from the spirit and scope of the invention as defined in the following claims.

What is claimed is:

1. A non-volatile memory device comprising:
   a channel link layer arranged over a substrate;
   an isolation layer arranged over the substrate and in the same horizontal layer as the channel link layer and filling the whole area of the horizontal layer where the channel link layer is not formed;
   a stack structure arranged over the channel link layer and the isolation layer having interlayer dielectric layers that are alternately stacked with gate electrode layers;
   a pair of channels connected to the channel link layer through the stack structure; and
   a memory layer interposed between each channel in the pair of channels and the stack structure and including a charge blocking layer, a charge trap layer and a tunnel insulation layer, wherein the isolation layer is not in contact with the memory layer and is formed of an insulation material.

2. The non-volatile memory device of claim 1, further comprising:
   a first buffer layer interposed between the substrate and the channel link layer and the isolation layer.

3. The non-volatile memory device of claim 1, further comprising:
   a second buffer layer interposed between the channel link layer and the isolation layer and the stack structure.

4. The non-volatile memory device of claim 1, wherein an uppermost gate electrode layer forms a select transistor and the rest of the gate electrode layers forms memory cells.

5. The non-volatile memory device of claim 1, wherein the stack structure comprises:
   a trench arranged between the pair of channels,
   wherein the gate electrode layers are isolated from each other by the trench.

6. The non-volatile memory device of claim 5, wherein a sidewall of the gate electrode layer making contact with the trench includes a silicide material.

7. The non-volatile memory device of claim 1, further comprising:
   a source line connected to one of the pair of channels and a bit line connected to a remaining one of the pair of channels,
   wherein the source line and the bit line are arranged on the pair of channels.

8. The non-volatile memory device of claim 1, further comprising:
   forming a peripheral circuit gate formed of a material substantially similar to a material of the channel link layer and positioned in the same layer with the channel link layer.

9. A non-volatile memory device comprising:
   a channel link layer arranged over a substrate;
   an isolation layer arranged over the substrate and in the same horizontal layer as the channel link layer and filling the whole area of the horizontal layer where the channel link layer is not formed;
   a stack structure arranged over the channel link layer and the isolation layer and including interlayer dielectric layers gate electrode layers alternately stacked therein;
   a pair of channels connected to the channel link layer through the stack structure;
   a memory layer interposed between each channel in the pair of channels and the stack structure and including a charge blocking layer, a charge trap layer and a tunnel insulation layer; and
   a drain select transistor and a source select transistor are formed above the stack structure, and the drain select transistor is formed along one of the pair of channels and the source select transistor is formed along the other of the pair of channels, wherein the isolation layer is not in contact with the memory layer and is formed of an insulation material.

* * * * *